(12) United States Patent
Antoni et al.

(10) Patent No.: US 6,947,124 B2
(45) Date of Patent: Sep. 20, 2005

(54) ILLUMINATION SYSTEM PARTICULARLY FOR MICROLITHOGRAPHY

(75) Inventors: Martin Antoni, Aalen (DE); Wolfgang Singer, Aalen (DE); Johannes Wangler, Königsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 49 days.

(21) Appl. No.: 10/381,625

(22) PCT Filed: Sep. 28, 2001

(86) PCT No.: PCT/EP01/11232

§ 371 (c)(1),
(2), (4) Date: Aug. 20, 2003

(87) PCT Pub. No.: WO02/27406

PCT Pub. Date: Apr. 4, 2002

(65) Prior Publication Data

US 2004/0017885 A1 Jan. 29, 2004

Related U.S. Application Data

(63) Continuation-in-part of application No. 10/201,652, filed on Jul. 22, 2002, and a continuation-in-part of application No. 10/150,650, filed on May 17, 2002, and a continuation-in-part of application No. 09/679,718, filed on Sep. 29, 2000, now Pat. No. 6,438,199, and a continuation-in-part of application No. 09/305,017, filed on May 4, 1999, now Pat. No. 6,198,793.

(30) Foreign Application Priority Data

May 5, 1998 (DE) .......................................... 198 19 898
Feb. 2, 1999 (DE) .......................................... 199 03 807
Feb. 8, 1999 (DE) ...................................... 299 02 108 U

(51) Int. Cl.$^7$ ...................... G03B 27/54; G03B 27/42; G21K 5/00
(52) U.S. Cl. ............................. 355/67; 355/53; 378/34
(58) Field of Search ............................. 355/53, 67–71; 359/366, 859; 378/34

(56) References Cited

U.S. PATENT DOCUMENTS

| 4,195,913 A | 4/1980 | Dourte et al. ................ 350/292 |
| 4,294,538 A | 10/1981 | Ban ............................ 355/51 |

(Continued)

FOREIGN PATENT DOCUMENTS

| DE | 199 03 807 A1 | 11/1999 |
| DE | 199 23 609 A1 | 12/1999 |

(Continued)

OTHER PUBLICATIONS

Murphy et al., "Synchrotron Radiation Sources and Condensers for Projection X–Ray Lithography", Applied Optics, vol. 32, No. 34, pp. 6920–6929 (Dec. 1, 1993).

(Continued)

Primary Examiner—Henry Hung Nguyen
(74) Attorney, Agent, or Firm—Ohlandt, Greeley, Ruggiero & Perle

(57) ABSTRACT

There is provided an illumination system for microlithography with wavelengths $\leq 193$ nm. The illumination system includes a primary light source, a first optical component, a second optical component, an image plane, and an exit pupil. The first optical component transforms the primary light source into a plurality of secondary light sources that are imaged by the second optical component in the exit pupil. The first optical component includes a first optical element having a plurality of first raster elements that are imaged into the image plane, producing a plurality of images being superimposed at least partially on a field in the image plane. The plurality of first raster elements are rectangular. The field is a segment of an annulus, and the second optical component includes a first field mirror with negative optical power for shaping the field to the segment of the annulus and a second field mirror with positive optical power. Each of a plurality of rays intersects the first field mirror with an incidence angle greater than 70° and each of the plurality of rays intersects the second field mirror with an incidence angle of less than 25°.

17 Claims, 12 Drawing Sheets

U.S. PATENT DOCUMENTS

| | | | | |
|---|---|---|---|---|
| 4,389,115 A | 6/1983 | Richter | ........................ | 355/26 |
| 4,651,012 A | 3/1987 | Clark et al. | .............. | 250/505.1 |
| 4,688,932 A | 8/1987 | Suzuki | ........................ | 355/51 |
| 4,740,276 A | 4/1988 | Marmo et al. | .................. | 204/7 |
| 4,974,919 A | 12/1990 | Muraki et al. | ............... | 350/6.6 |
| 5,071,240 A | 12/1991 | Ichihara et al. | ............. | 359/366 |
| 5,148,442 A | 9/1992 | O'Neil et al. | .................. | 372/71 |
| 5,222,112 A | 6/1993 | Terasawa et al. | ............. | 378/34 |
| 5,339,346 A | 8/1994 | White | ........................ | 378/34 |
| 5,361,292 A | 11/1994 | Sweatt | ........................ | 378/34 |
| 5,402,267 A | 3/1995 | Fürter et al. | ................ | 359/727 |
| 5,439,781 A | 8/1995 | MacDowell et al. | ........ | 460/311 |
| 5,440,423 A | 8/1995 | Ogura | ........................ | 359/365 |
| 5,459,547 A | 10/1995 | Shiozawa | .................... | 355/67 |
| 5,499,282 A | 3/1996 | Silfvast | ...................... | 378/119 |
| 5,512,759 A | 4/1996 | Sweatt | ........................ | 250/492.1 |
| 5,581,605 A | 12/1996 | Murakami et al. | ............ | 378/84 |
| 5,644,383 A | 7/1997 | Mori | ........................... | 355/68 |
| 5,647,664 A | 7/1997 | Hanečka | ...................... | 362/308 |
| 5,669,708 A | 9/1997 | Mashima et al. | ........... | 362/341 |
| 5,677,939 A | 10/1997 | Oshino | ........................ | 378/34 |
| 5,715,084 A | 2/1998 | Takahashi et al. | .......... | 359/487 |
| 5,737,137 A | 4/1998 | Cohen et al. | ................ | 359/859 |
| 5,755,503 A | 5/1998 | Chen et al. | ................... | 353/38 |
| 5,796,524 A | 8/1998 | Oomura | ........................ | 359/633 |
| 5,805,356 A | 9/1998 | Chiba | ......................... | 359/727 |
| 5,846,678 A | 12/1998 | Nishigori et al. | ............ | 430/30 |
| 5,896,438 A | 4/1999 | Miyake et al. | ................ | 378/34 |
| 5,963,305 A | 10/1999 | Mizouchi | .................... | 355/67 |
| 5,993,010 A | 11/1999 | Ohzawa et al. | ............... | 353/99 |
| 5,995,582 A | 11/1999 | Terashima et al. | ............ | 378/34 |
| 6,081,319 A | 6/2000 | Ozawa et al. | ................ | 355/67 |
| 6,198,793 B1 | 3/2001 | Schultz et al. | ................ | 378/34 |
| 6,208,707 B1 | 3/2001 | Oshino | ........................ | 378/34 |
| 6,229,647 B1 | 5/2001 | Takahashi et al. | .......... | 359/487 |
| 6,285,443 B1 * | 9/2001 | Wangler et al. | ............... | 355/67 |
| 6,339,467 B1 | 1/2002 | Sato | ........................... | 355/77 |
| 6,400,794 B1 | 6/2002 | Schultz et al. | ................ | 378/34 |
| 6,438,199 B1 | 8/2002 | Schultz et al. | ................ | 378/34 |
| 6,507,440 B1 | 1/2003 | Schultz | ....................... | 359/626 |
| 6,570,168 B1 * | 5/2003 | Schultz et al. | ........... | 250/492.2 |
| 6,583,937 B1 | 6/2003 | Wangler et al. | ............. | 359/624 |
| 6,594,334 B1 | 7/2003 | Ota | ............................. | 378/34 |
| RE38,438 E | 2/2004 | Takahashi | ................... | 359/727 |

FOREIGN PATENT DOCUMENTS

| | | |
|---|---|---|
| EP | 0066295 A1 | 12/1982 |
| EP | 0359018 A2 | 3/1990 |
| EP | 0 627 667 A1 | 12/1994 |
| EP | 0 779 558 A2 | 6/1997 |
| EP | 0939341 A2 | 9/1999 |
| EP | 0 955 641 A1 | 11/1999 |
| EP | 1026547 A2 | 8/2000 |
| EP | 1 067 437 A2 | 1/2001 |
| EP | 1 200 878 A2 | 5/2002 |

OTHER PUBLICATIONS

"Handbook on Synchrotron Radiation", Emst–Echard Koch ed., pp. 140–145, 1098–1111 (1983).

European Search Report dated May 12, 2004. EP Patent Application No. 04 00 3479.

* cited by examiner

ILLUMINATION SYSTEM PARTICULARLY FOR MICROLITHOGRAPHY

REFERENCE TO RELATED APPLICATIONS

The present application is (a) a U.S. national stage entry of International Application No. PCT/EP01/11232, and (b) a continuation-in part of U.S. patent application Ser. No. 10/201,652. The PCT/EP01/11232 application was filed Sep. 28, 2001, and claims priority of U.S. patent application Ser. No. 09/679,718. The 10/201,652 application was filed Jul. 22, 2002, and is (a) a continuation-in part of U.S. patent application Ser. No. 10/150,650, and (b) a continuation-in part of the 09/679,718 application. The 10/150,650 application was filed May 17, 2002, and is a continuation-in-part of the 09/679,718 application. The 09/679,718 application was filed Sep. 29, 2000, issued as U.S. Pat. No. 6,438,199, and is a continuation-in part of U.S. patent application Ser. No. 09/305,017. The 09/305,017 application was filed May 4, 1999, and issued as U.S. Pat. No. 6,198,793. The present application is also claiming priority of (a) International Application No. PCT/EP00/07258, filed Jul. 28, 2000, (b) German Patent Application No. 299 02 108, filed Feb. 8, 1999, (c) German Patent Application No. 199 03 807, filed Feb. 2, 1999, and (d) German Patent Application No. 198 19 898, filed on May 5, 1998.

BACKGROUND OF THE INVENTION

1. Field of the Invention

The invention concerns an illumination system for wavelengths $\leq 193$ nm as well as a projection exposure apparatus with such an illumination system.

2. Description of the Related Art

In order to be able to further reduce the structural widths of electronic components, particularly in the submicron range, it is necessary to reduce the wavelengths of the light utilized for microlithography. Lithography with very deep UV radiation, so called VUV (Very deep UV) lithography or with soft x-ray radiation, so-called EUV (extreme UV) lithography, is conceivable at wavelengths smaller than 193 nm, for example.

An illumination system for a lithographic device, which uses EUV radiation, has been made known from U.S. Pat. No. 5,339,346. For uniform illumination in the reticle plane and filling of the pupil, U.S. Pat. No. 5,339,346 proposes a condenser, which is constructed as a collector lens and comprises at least 4 pairs of mirror facets, which are arranged symmetrically. A plasma light source is used as the light source.

In U.S. Pat. No. 5,737,137, an illumination system with a plasma light source comprising a condenser mirror is shown, in which an illumination of a mask or a reticle to be illuminated is achieved by means of spherical mirrors.

U.S. Pat. No. 5,361,292 shows an illumination system, in which a plasma light source is provided, and the point plasma light source is imaged in an annular illuminated surface by means of a condenser, which has five aspherical mirrors arranged off-center.

From U.S. Pat. No. 5,581,605, an illumination system has been made known, in which a photon beam is split into a multiple number of secondary light sources by means of a plate with concave raster elements. In this way, a homogeneous or uniform illumination is achieved in the reticle plane. The imaging of the reticle on the wafer to be exposed is produced by means of a conventional reduction optics. A gridded mirror is precisely provided with equally curved elements in the illumination beam path. The contents of the above-mentioned patents are incorporated by reference.

EP-A-0 939 341 shows an illumination system and exposure apparatus for illuminating a surface over an illumination field having an arcuate shape with X-ray wave length light. The illumination system comprises first and second optical integrators each with a plurality of reflecting elements. The first and second optical integrators being opposingly arranged such that a plurality of light source images are formed at the plurality of reflecting elements of the second optical integrator. To form an arcuate shaped illumination field in the field plane according to EP-A-0 939 341 the reflecting elements of the first optical integrator have an arcuate shape similar to the arcuate illumination field. Such reflecting elements are complicate to manufacture.

EP-A-1 026 547 also shows an illumination system with two optical integrators. Similar to the system of EP-A-0 939 341 the reflecting elements of the first optical integrator have an arcuate shape for forming an arcuate shaped illumination field in the field plane.

In EP-A-0 955 641 a system with two optical integrators is shown. Each of said optical integrators comprises a plurality of raster-elements. The raster elements of the first optical integrator are of rectangular shape. The arc-shaped field in the field plane is formed by at least one grazing incidence field mirror. The content of the above mentioned patent-application is incorporated by reference. All above mentioned illumination systems have the disadvantage that the track-length of the illumination system is large.

It is therefore an object of the invention to overcome the disadvantages of the illumination systems according to the state of the art, to provide an illumination system for microlithography that fulfills the requirements for advanced lithography with wavelength less or equal to 193 nm and which is of compact size.

SUMMARY OF THE INVENTION

The object of the invention is solved by an illumination system with the features of claim 1 and by an projection exposure apparatus according to claim 17.

The system illuminates a structured reticle arranged in the image plane of the illumination system, which will be imaged by a projection objective onto a light sensitive substrate. In reflective lithography systems the reticle is illuminated with an arc-shaped field, wherein a pregiven uniformity of the scanning energy distribution inside the field is required, for example better than ±5%. The scanning energy is defined as the line integral over the light intensity in the scanning direction. A further requirement is the illumination of the exit pupil of the illumination system, which is located at the entrance pupil of the projection objective. A nearly field-independent illumination of the exit pupil is required.

Typical light sources for wavelengths between 100 nm and 200 nm are excimer lasers, for example an ArF-Laser for 193 nm, an $F_2$-Laser for 157 nm, an $Ar_2$-Laser for 126 nm and an NeF-Laser for 109 nm. For systems in this wavelength region refractive components of $SiO_2$, $CaF_2$, $BaF_2$ or other crystallites are used. Since the transmission of the optical materials deteriorates with decreasing wavelength, the illumination systems are designed with a combination of refractive and reflective components. For wavelengths in the EUV wavelength region, between 10 nm and 20 nm, the projection exposure apparatus is designed as all-reflective. A typical EUV light source is a Laser-Produced-Plasma-source, a Pinch-Plasma-Source, a Wiggler-Source or an Undulator-Source.

The light of this primary light source is directed to a first optical element, wherein the first optical element is part of a first optical component. The first optical element is organized as a plurality of first raster elements and transforms the primary light source into a plurality of secondary light sources. Each first raster element corresponds to one secondary light source and focuses an incoming ray bundle, defined by all rays intersecting the first raster element, to the corresponding secondary light source. The secondary light sources are arranged in a pupil plane of the illumination system or nearby this plane. A second optical component is arranged between the pupil plane and the image plane of the illumination system to image the secondary light sources into an exit pupil of the illumination system, which corresponds to the entrance pupil of a following projection objective. The images of the secondary light sources in the exit pupil of the illumination system are therefore called tertiary light sources.

The first raster elements are imaged into the image plane, wherein their images are at least partially superimposed on a field that must be illuminated. Therefore, they are known as field raster elements or field honeycombs.

The field raster elements are preferably rectangular. Rectangular field raster elements have the advantage that they can be arranged in rows being displaced against each other. Depending on the field to be illuminated they have a side aspect ratio in the range of 5:1 and 20:1. The length of the rectangular field raster elements is typically between 15 mm and 50 mm, the width is between 1 mm and 4 mm.

To illuminate an arc-shaped field in the image plane with rectangular field raster elements the second optical component of the illumination system comprises a first field mirror for transforming the rectangular images of the rectangular field raster elements to arc-shaped images. The arc length is typically in the range of 80 mm to 105 mm, the radial width in the range of 5 mm to 9 mm. The transformation of the rectangular images of the rectangular field raster elements can be done by conical reflection with the first field mirror being a grazing incidence mirror with negative optical power. In other words, the imaging of the field raster elements is distorted to get the arc-shaped images, wherein the radius of the arc is determined by the shape of the object field of the projection objective. The first field mirror is preferably arranged in front of the image plane of the illumination system, wherein there should be a free working distance. For a configuration with a reflective reticle the free working distance has to be adapted to the fact that the rays traveling from the reticle to the projection objective are not vignetted by the first field mirror.

The surface of the first field mirror is preferably an off-axis segment of a rotational symmetric reflective surface, which can be designed aspherical or spherical. The axis of symmetry of the supporting surface goes through the vertex of the surface. Therefore a segment around the vertex is called on-axis, wherein each segment of the surfaces which does not include the vertex is called off-axis. The supporting surface can be manufactured more easily due to the rotational symmetry. After producing the supporting surface the segment can be cut out with well-known techniques.

The surface of the first field mirror can also be designed as an on-axis segment of a toroidal reflective surface. Therefore the surface has to be processed locally, but has the advantage that the surrounding shape can be produced before surface treatment.

The incidence angles of the incoming rays with respect to the surface normals at the points of incidence of the incoming rays on the first field mirror are preferably greater than 70°, which results in a reflectivity of the first field mirror of more than 80%.

The second optical component comprises a second field mirror with positive optical power. The first and second field mirror together image the secondary light sources or the pupil plane respectively into the exit pupil of the illumination system, which is defined by the entrance pupil of the projection objective. The second field mirror is arranged between the plane with the secondary light sources and the first field mirror.

The second field mirror is preferably an off-axis segment of a rotational symmetric reflective surface, which can be designed aspherical or spherical, or an on-axis segment of a toroidal reflective surface.

The incidence angles of the incoming rays with respect to the surface normals at the points of incidence of the incoming rays on the second field mirror are preferably lower than 25°. Since the mirrors have to be coated with multilayers for the EUV wavelength region, the divergence and the incidence angles of the incoming rays are preferably as low as possible to increase the reflectivity, which should be better than 65%.

To reduce the length of the illumination system the field lens comprises preferably a third field mirror. The third field mirror is preferably arranged between the plane with the secondary light sources and the second field mirror.

The third field mirror has preferably negative optical power and forms together with the second and first field mirror an optical telescope system having a object plane at the secondary light sources and an image plane at the exit pupil of the illumination system to image the secondary light sources into the exit pupil. The pupil plane of the telescope system is arranged at the image plane of the illumination system. Therefore the ray bundles coming from the secondary light sources are superimposed in the pupil plane of the telescope system or in the image plane of the illumination system accordingly. The first field mirror has mainly the function of forming the arc-shaped field, wherein the telescope system is mainly determined by the negative third field mirror and the positive second field mirror.

In another embodiment the third field mirror has preferably positive optical power to generate images of the secondary light sources in a plane between the third and second field mirror, forming tertiary light sources. The tertiary light sources are imaged with the second field mirror and the first field mirror into the exit pupil of the illumination system. The images of the tertiary light sources in the exit pupil of the illumination system are called in this case quaternary light sources.

Since the plane with the tertiary light sources is arranged conjugated to the exit pupil, this plane can be used to arrange masking blades to change the illumination mode or to add transmission filters. This position in the beam path has the advantage to be freely accessible.

The third field mirror is similar to the second field mirror preferably an off-axis segment of a rotational symmetric reflective surface, which can be designed aspherical or spherical, or an on-axis segment of a toroidal reflective surface.

The incidence angles of the incoming rays with respect to the surface normals at the points of incidence of the incoming rays on the third field mirror are preferably lower than 25°. With the third field mirror being arranged as a normal incidence mirror the beam path can be folded again to reduce the overall size of the illumination system.

To avoid vignetting of the beam path the first, second and third field mirrors are preferably arranged in a non-centered system. There is no common axis of symmetry for the mirrors. An optical axis can be defined as a connecting line between the centers of the used areas on the field mirrors, wherein the optical axis is bent at the field mirrors depending on the tilt angles of the field mirrors.

It is advantageous to insert a second optical element with second raster elements in the light path after the first optical element with first raster elements, wherein one first raster element corresponds to one of the second raster elements. In this case deflection angles of the first raster elements are designed to deflect the ray bundles impinging on the first raster elements to the corresponding second raster elements.

The second raster elements are preferably arranged at the secondary light sources and are designed to image together with the field lens the first raster elements or field raster elements into the image plane of the illumination system, wherein the images of the field raster elements are at least partially superimposed. The second raster elements are called pupil raster elements or pupil honeycombs.

With the tilt angles of the reflective components of the illumination system the beam paths between the components can be bent. Therefore the orientation of the beam cone emitted by the source and the orientation of the image plane system can be arranged according to the requirements of the overall system. A preferable configuration has a source emitting a beam cone in one direction and an image plane having a surface normal which is oriented almost perpendicular to this direction. In one embodiment the source emits horizontally and the image plane has a vertical surface normal. Some light sources like undulator or wiggler sources emit only in the horizontal plane. On the other hand the reticle should be arranged horizontally for gravity reasons. The beam path therefore has to be bent between the light source and the image plane about almost 90°. Since mirrors with incidence angles between 30° and 60° lead to polarization effects and therefore to light losses, the beam bending has to be done only with grazing incidence or normal incidence mirrors. For efficiency reasons the number of mirrors has to be as small as possible.

By definition all rays intersecting the field in the image plane have to go through the exit pupil of the illumination system. The position of the field and the position of the exit pupil are defined by the object field and the entrance pupil of the projection objective. For some projection objectives being centered systems the object field is arranged off-axis of an optical axis, wherein the entrance pupil is arranged on-axis in a finite distance to the object plane. For these projection objectives an angle between a straight line from the center of the object field to the center of the entrance pupil and the surface normal of the object plane can be defined. This angle is in the range of 3° to 10° for EUV projection objectives. Therefore the components of the illumination system have to be configured and arranged in such a way that all rays intersecting the object field of the projection objective are going through the entrance pupil of the projection objective being decentered to the object field. For projection exposure apparatus with a reflective reticle all rays intersecting the reticle needs to have incidence angles greater than 0° to avoid vignetting of the reflected rays at components of the illumination system.

In the EUV wavelength region all components are reflective components, which are arranged preferably in such a way, that all incidence angles on the components are lower than 25° or greater than 65°. Therefore polarization effects arising for incidence angles around an angle of 45° are minimized. Since grazing incidence mirrors have a reflectivity greater than 80%, they are preferable in the optical design in comparison to normal incidence mirrors with a reflectivity greater than 65%.

The illumination system is typically arranged in a mechanical box. By folding the beam path with mirrors the overall size of the box can be reduced. This box preferably does not interfere with the image plane, in which the reticle and the reticle supporting system are arranged. Therefore it is advantageous to arrange and tilt the reflective components in such a way that all components are completely arranged on one side of the reticle. This can be achieved if the field lens comprises only an even number of normal incidence mirrors.

The illumination system as described before can be used preferably in a projection exposure apparatus comprising the illumination system, a reticle arranged in the image plane of the illumination system and a projection objective to image the reticle onto a wafer arranged in the image plane of the projection objective. Both, reticle and wafer are arranged on a support unit, which allows the exchange or scan of the reticle or wafer.

The projection objective can be a catadioptric lens, as known from U.S. Pat. No. 5,402,267 for wavelengths in the range between 100 nm and 200 nm. These systems have typically a transmission reticle.

For the EUV wavelength range the projection objectives are preferably all-reflective systems with four to eight mirrors as known for example from U.S. Ser. No. 09/503640 showing a six mirror projection lens. These systems have typically a reflective reticle.

For systems with a reflective reticle the illumination beam path between the light source and the reticle and the projection beam path between the reticle and the wafer preferably interfere only nearby the reticle, where the incoming and reflected rays for adjacent object points are traveling in the same region. If there are no further crossing of the illumination and projection beam path it is possible to separate the illumination system and the projection objective except for the reticle region.

The projection objective has preferably a projection beam path between said reticle and the first imaging element which is tilted toward the optical axis of the projection objective. Especially for a projection exposure apparatus with a reflective reticle the separation of the illumination system and the projection objective is easier to achieve.

BRIEF DESCRIPTION OF THE DRAWINGS

The invention will be described below on the basis of the following drawings.

DESCRIPTION OF THE INVENTION

Figure 1:
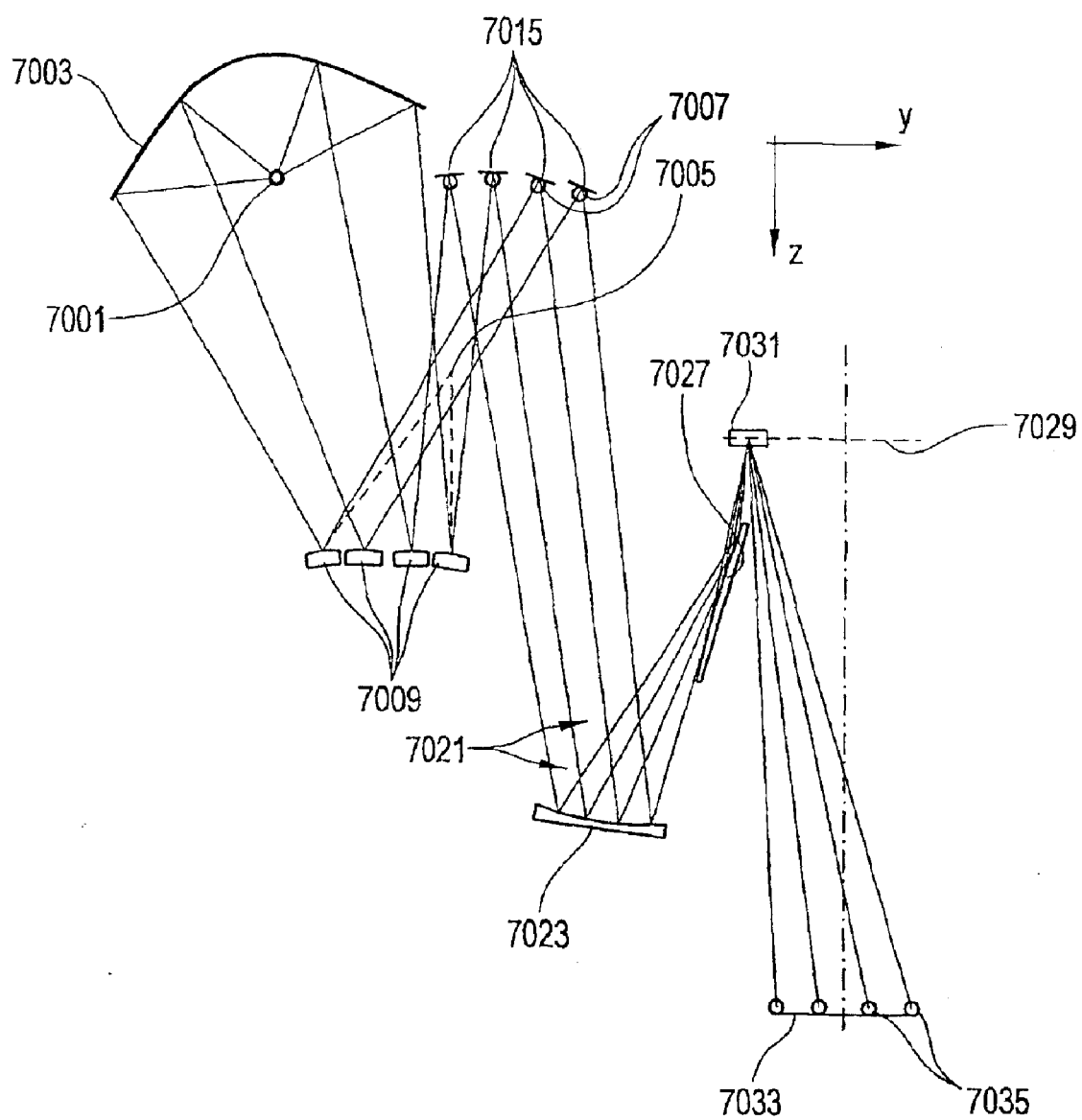
FIG. 1: A schematic view of a first embodiment with convex mirrors as field raster elements and planar mirrors as pupil raster elements

FIG. 1 shows an first embodiment of the invention in a schematically view. The beam cone of the light source 7001 is collected by the ellipsoidal collector mirror 7003 and is directed to the plate with the field raster elements 7009. The collector mirror 7003 is designed to generate an image 7005 of the light source 7001 between the plate with the field raster elements 7009 and the plate with the pupil raster elements 7015 if the plate with the field raster elements 7009 would be a planar mirror as indicated by the dashed lines. The convex field raster elements 7009 are designed to generate point-like secondary light sources 7007 at the pupil raster elements 7015, since the light source 7001 is also point-like. Therefore the pupil raster elements 7015 are designed as planar mirrors. Since the intensity at the point-like secondary light sources 7007 is very high, the planar pupil raster elements 7015 can alternatively be arranged defocused from the secondary light sources 7007. The distance between the secondary light sources 7007 and the pupil raster elements 7015 should not exceed 20% of the distance between the field raster elements and the pupil raster elements. The pupil raster elements 7015 are tilted to superimpose the images of the field raster elements 7009 together with the field lens 7021 formed as the field mirrors 7023 and 7027 in the field 7031 to be illuminated. Both, the field raster elements 7009 and the pupil raster elements 7015 are tilted. Therefore the assignment between the field raster elements 7009 and pupil raster elements 7015 is defined by the user. In the embodiment of FIG. 1 the field raster elements at the center of the plate with the field raster elements 7009 correspond to the pupil raster elements at the border of the plate with the pupil raster elements 7015 and vice versa. The tilt angles and the tilt axes of the field raster elements are determined by the directions of the incoming ray bundles and by the positions of the corresponding pupil raster elements 7015. Since for each field raster element 7009 the tilt angle and the tilt axis is different, also the planes of incidence defined by the incoming and reflected centroid rays are not parallel. The tilt angles and the tilt axes of the pupil raster elements 7015 are determined by the positions of the corresponding field raster elements 7009 and the requirement that the images of the field raster elements 7009 have to be superimposed in the field 7031 to be illuminated. The concave field mirror 7023 images the secondary light sources 7007 into the exit pupil 7033 of the illumination system forming tertiary light sources 7035, wherein the convex field mirror 7027 being arranged at grazing incidence transforms the rectangular images of the rectangular field raster elements 7009 into arc-shaped images.

Figure 2:
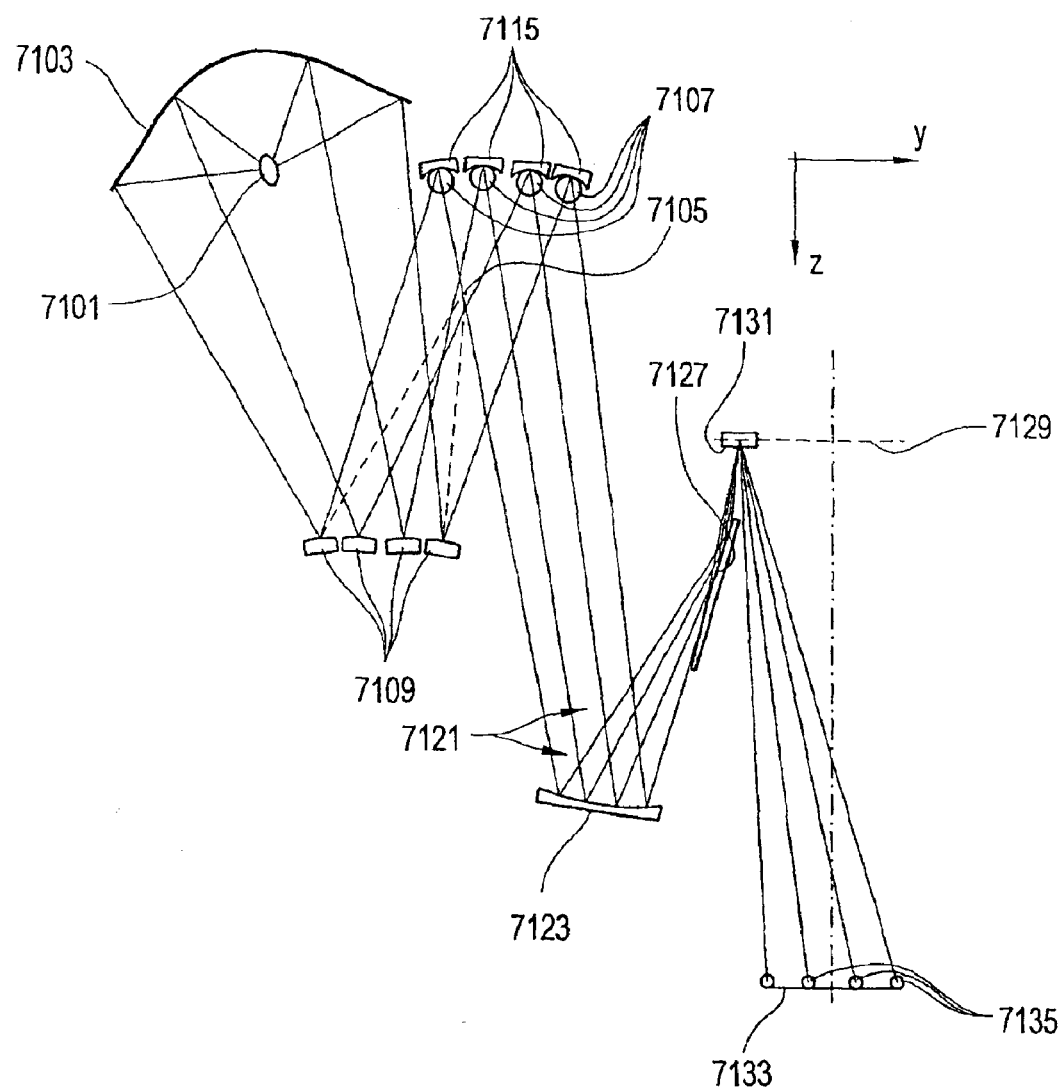
FIG. 2: A schematic view of a second embodiment with convex mirrors as field raster elements and concave mirrors as pupil raster elements.

FIG. 2 shows second embodiment in a schematically view. Corresponding elements have the same reference numbers as those in FIG. 1 increased by 100. Therefore, the description to these elements is found in the description to FIG. 1. In this embodiment the light source 7101 and therefore also the secondary light sources 7107 are extended. The pupil raster elements 7115 are designed as concave mirrors to image the field raster elements 7109 into the image plane 7129. It is also possible to arrange the pupil raster elements 7115 not at the secondary light sources 7107, but defocused. The influence of the defocus on the imaging of the field raster elements 7109 has to be considered in the optical power of the pupil raster elements.

Figure 3:
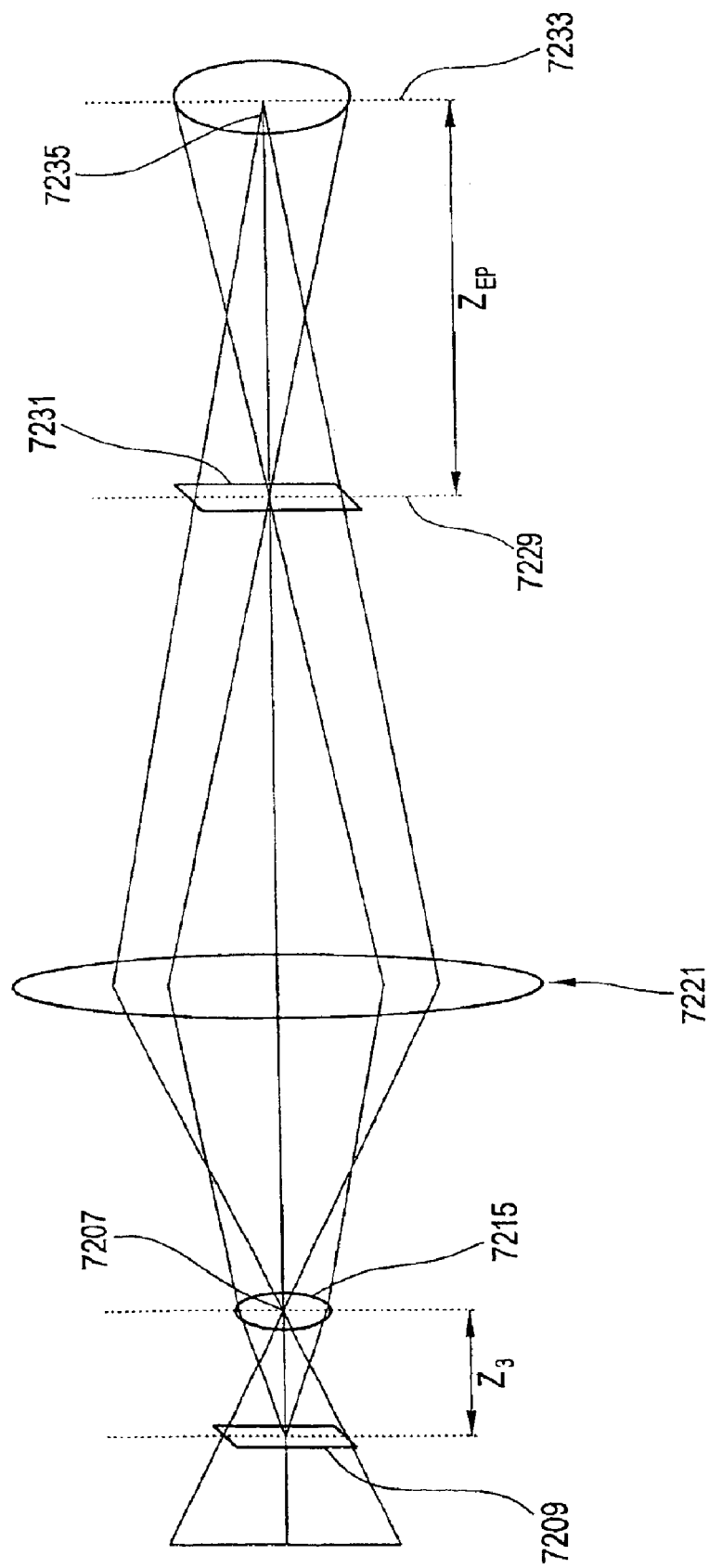
FIG. 3: A schematic view of the principal setup of an illumination system.

FIG. 3 shows in a schematic view the imaging of one field raster element 7209 into the reticle plane 7229 forming an image 7231 and the imaging of the corresponding secondary light source 7207 into the exit pupil 7233 of the illumination system forming a tertiary light source 7235. Corresponding elements have the same reference numbers as those in FIG. 1 increased by 200. Therefore, the description to these elements is found in the description to FIG. 1.

The field raster elements 7209 are rectangular and have a length $X_{FRE}$ and a width $Y_{FRE}$. All field raster elements 7209 are arranged on a nearly circular plate with a diameter $D_{FRE}$. They are imaged into the image plane 7229 and superimposed on a field 7231 with a length $X_{field}$ and a width $Y_{field}$, wherein the maximum aperture in the image plane 7229 is denoted by $NA_{field}$. The field size corresponds to the size of the object field of the projection objective, for which the illumination system is adapted to.

The plate with the pupil raster elements 7215 is arranged in a distance of $Z_3$ from the plate with the field raster elements 7209. The shape of the pupil raster elements 7215 depends on the shape of the secondary light sources 7207. For circular secondary light sources 7207 the pupil raster elements 7215 are circular or hexagonal for a dense packaging of the pupil raster elements 7215. The diameter of the plate with the pupil raster elements 7215 is denoted by $D_{PRE}$.

The pupil raster elements 7215 are imaged by the second optical component, which is depicted in FIG. 3 as a field lens 7221 into the exit pupil 7233 having a diameter of $D_{EP}$. The distance between the image plane 7229 of the illumination system and the exit pupil 7233 is denoted with $Z_{EP}$. Since the exit pupil 7233 of the illumination system corresponds to the entrance pupil of the projection objective, the distance $Z_{EP}$ and the diameter $D_{EP}$ are predetermined values. The entrance pupil of the projection objective is typically illuminated up to a user-defined filling ratio σ.

The data for a preliminary design of the illumination system can be calculated with the equations and data given below. The values for the parameters are typical for a EUV projection exposure apparatus. But there is no limitation to these values. Wherein the schematic design is shown for a refractive linear system it can be easily adapted for reflective systems by exchanging the lenses with mirrors.

The field 7231 to be illuminated is defined by a segment of an annulus. The Radius of the annulus is $R_{field}$=138 mm.

The length and the width of the segment are $X_{field}$=88 mm, $Y_{field}$=8 mm

Without the field-forming field mirror of the second optical component which transforms the rectangular images of the field raster elements into arc-shaped images the field to be illuminated is rectangular with the length and width defined by the segment of the annulus.

The distance from the image plane to the exit pupil is $Z_{EP}$=1320 mm.

The object field of the projection objective is an off-axis field. The distance between the center of the field and the optical axis of the projection objective is given by the radius $R_{field}$. Therefore the incidence angle of the centroid ray in the center of the field is 6°.

The aperture at the image plane of the projection objective is $NA_{wafer}=0.25$. For a reduction projection objective with a magnification ratio of $\beta_{proj}=-0.25$ and a filling ratio of $\sigma=0.8$ the aperture at the image plane of the illumination system is $$NA_{field} = \sigma \cdot \frac{NA_{wafer}}{4} = 0.05$$

$$D_{EP}=2\tan|\arcsin(NA_{field})|\cdot Z_{EP} \approx 2NA_{EP}\cdot Z_{EP} \approx 132 \text{ mm}$$

The distance $Z_3$ between the field raster elements and the pupil raster elements is related to the distance $Z_{EP}$ between the image plane and the exit pupil by the depth magnification $\alpha$:

$$Z_{EP}=\alpha \cdot Z_3$$

The size of the field raster elements is related to the field size by the lateral magnification $\beta_{field}$:

$$X_{field}=\beta_{field}\cdot X_{FRE}$$

$$Y_{field}=\beta_{field}\cdot Y_{FRE}$$

The diameter $D_{PRE}$ of the plate with the pupil raster elements and the diameter $D_{EP}$ of the exit pupil are related by the lateral magnification $\beta_{pupil}$:

$$D_{EP}=\beta_{pupil}\cdot D_{PRE}$$

The depth magnification $\alpha$ is defined by the product of the lateral magnifications $\beta_{field}$ and $\beta_{pupil}$:

$$\alpha=\beta_{field}\cdot\beta_{pupil}$$

The number of raster elements being superimposed at the field is set to 200.

With this high number of superimposed images the required field illumination uniformity can be achieved.

Another requirement is to minimize the incidence angles on the components. For a reflective system the beam path is bent at the plate with the field raster elements and at the plate with the pupil raster elements. The bending angles and therefore the incidence angles are minimum for equal diameters of the two plates:

$$D_{PRE}=D_{FRE}$$

$$200\cdot X_{PRE}\cdot Y_{PRE} = 200\cdot\frac{X_{field}\cdot Y_{field}}{\beta_{field}^2} = \frac{D_{EP}^2}{\beta_{pupil}^2} = \frac{\beta_{field}^2}{\alpha^2}D_{EP}^2$$

The distance $Z_3$ is set to $Z_3=900$ mm. This distance is a compromise between low incidence angles and a reduced overall length of the illumination system.

$$\alpha = \frac{Z_{EP}}{Z_3} = 1.47$$

Therefore $$|\beta_{field}| \approx \sqrt[4]{\frac{200\cdot X_{field}\cdot Y_{field}}{D_{EP}^2}\alpha^2} \approx 2.05$$

$$|\beta_{pupil}| \approx \frac{\alpha}{\beta_{field}} \approx 0.7$$

$$D_{FRE} = D_{PRE} = \frac{\beta_{field}}{\alpha}D_{EP} \approx 200 \text{ mm}$$

$$X_{FRE} = \frac{X_{field}}{\beta_{field}} \approx 43 \text{ mm}$$

$$Y_{FRE} = \frac{Y_{field}}{\beta_{field}} \approx 4 \text{ mm}$$

With these values the principal layout of the illumination system is known.

Figure 4:
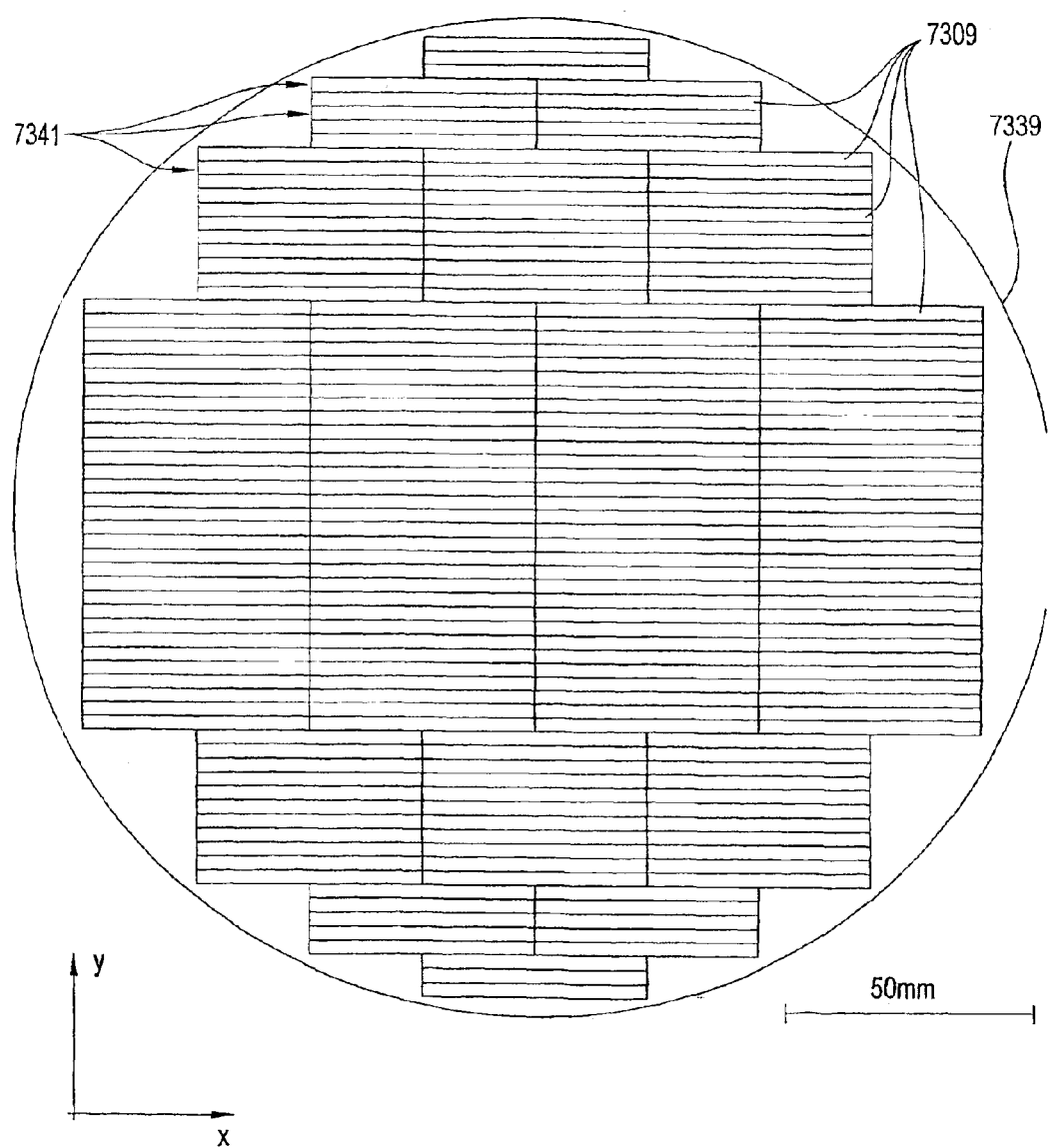
FIG. 4: An Arrangement of the field raster elements.

In a next step the field raster elements 7309 have to be distributed on the plate as shown in FIG. 4. The two-dimensional arrangement of the field raster elements 7309 is optimized for efficiency. Therefore the distance between the field raster elements 7309 is as small as possible. Field raster elements 7309, which are only partially illuminated, will lead to uniformity errors of the intensity distribution in the image plane, especially in the case of a restricted number of field raster elements 7309. Therefore only these field raster elements 7309 are imaged into the image plane which are illuminated almost completely. FIG. 4 shows a possible arrangement of 216 field raster elements 7309. The solid line 7339 represents the border of the circular illumination of the plate with the field raster elements 7309. Therefore the filling efficiency is approximately 90%. The rectangular field raster elements 7309 have a length $X_{FRE}=46.0$ mm and a width $Y_{FRE}=2.8$ mm. All field raster elements 7309 are inside the circle 7339 with a diameter of 200 mm. The field raster elements 7309 are arranged in 69 rows 7341 being arranged one among another. The field raster elements 7309 in the rows 7341 are attached at the smaller y-side of the field raster elements 7309. The rows 7341 consist of one, two, three or four field raster elements 7309. Some rows 7341 are displaced relative to the adjacent rows 7341 to distribute the field raster elements 7309 inside the circle 7339. The distribution is symmetrical to the y-axis.

Figure 5:
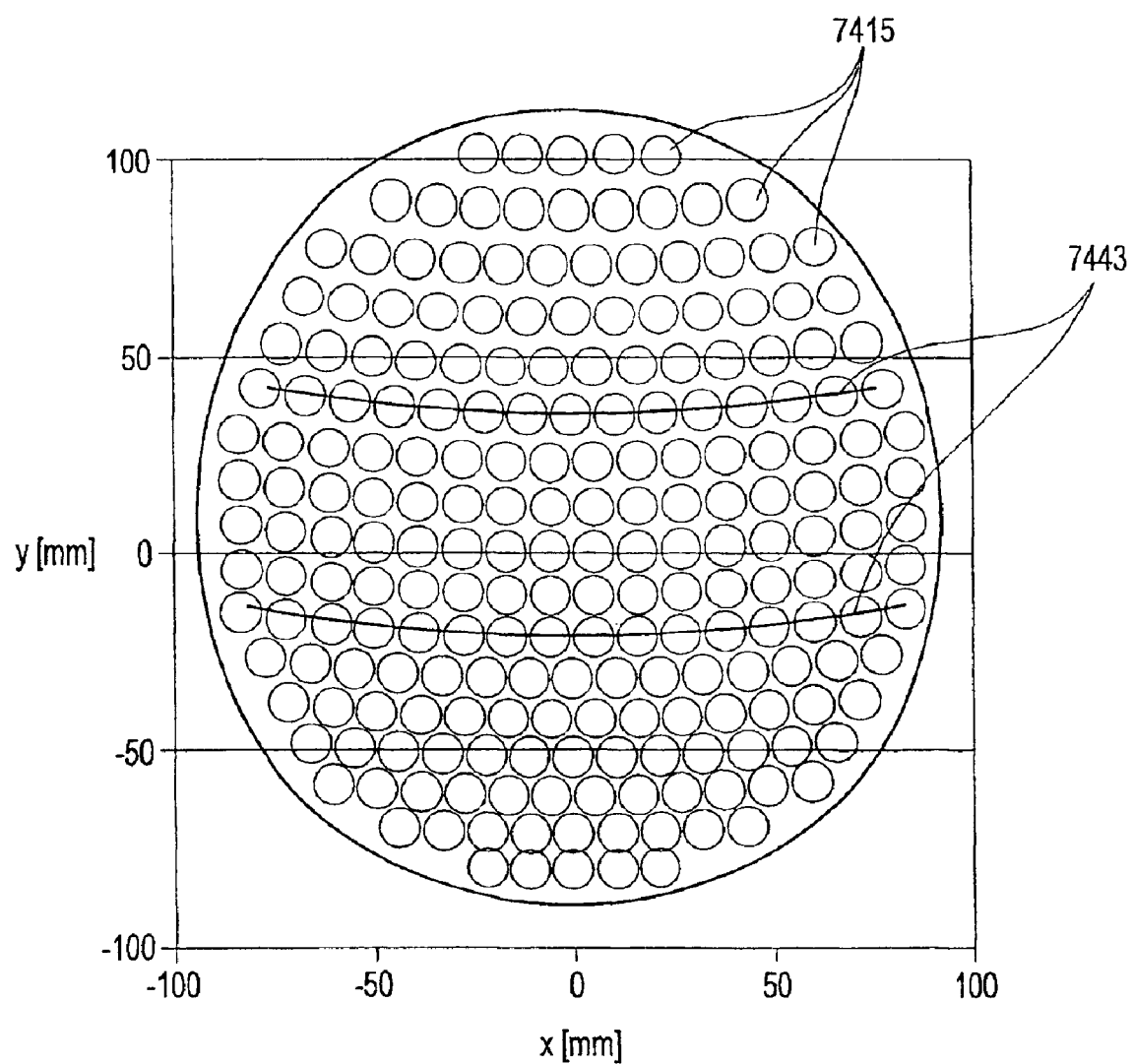
FIG. 5: An Arrangement of the pupil raster elements.

FIG. 5 shows the arrangement of the pupil raster elements 7415. They are arranged on a distorted grid to compensate for distortion errors of the field lens. If this distorted grid of pupil raster elements 7415 is imaged into the exit pupil of the illumination system by the field lens an undistorted regular grid of tertiary light sources will be generated. The pupil raster elements 7415 are arranged on curved lines 7443 to compensate the distortion introduced by the field-forming field mirror. The distance between adjacent pupil raster elements 7415 is increased in y-direction to compensate the distortion introduced by field mirrors being tilted about the x-axis. Therefore the pupil raster elements 7415 are not arranged inside a circle. The size of the pupil raster elements 7415 depends on the source size or source étendue. If the source étendue is much smaller than the required étendue in the image plane, the secondary light sources will not fill the plate with the pupil raster elements 7415 completely. In this case the pupil raster elements 7415 need only to cover the area of the secondary light sources plus some overlay to compensate for source movements and imaging aberrations of the collector-field raster element unit. In FIG. 5 circular pupil raster elements 7415 are shown.

Each field raster element 7309 correspond to one of the pupil raster elements 7415 according to a assignment table and is tilted to deflect an incoming ray bundle to the corresponding pupil raster element 7415. A ray coming from the center of the light source and intersecting the field raster element 7309 at its center is deflected to intersect the center of the corresponding pupil raster element 7415. The tilt angle and tilt axis of the pupil raster element 7415 is designed to deflect this ray in such a way, that the ray intersects the field in its center.

The second optical component comprising the field mirror images the plate with the pupil raster elements into the exit pupil and generates the arc-shaped field with the desired radius $R_{field}$. For $R_{field}$=138 mm, the field forming gracing incidence field mirror has only low negative optical power. The optical power of the field-forming field mirror has to be negative to get the correct orientation of the arc-shaped field. Since the magnification ratio of the second optical component has to be positive, another field mirror with positive optical power is required. The field mirror with positive optical power is a normal incidence mirror. The usage of a normal incidence mirror provides for a compact size of the illumination system.

Figure 6:
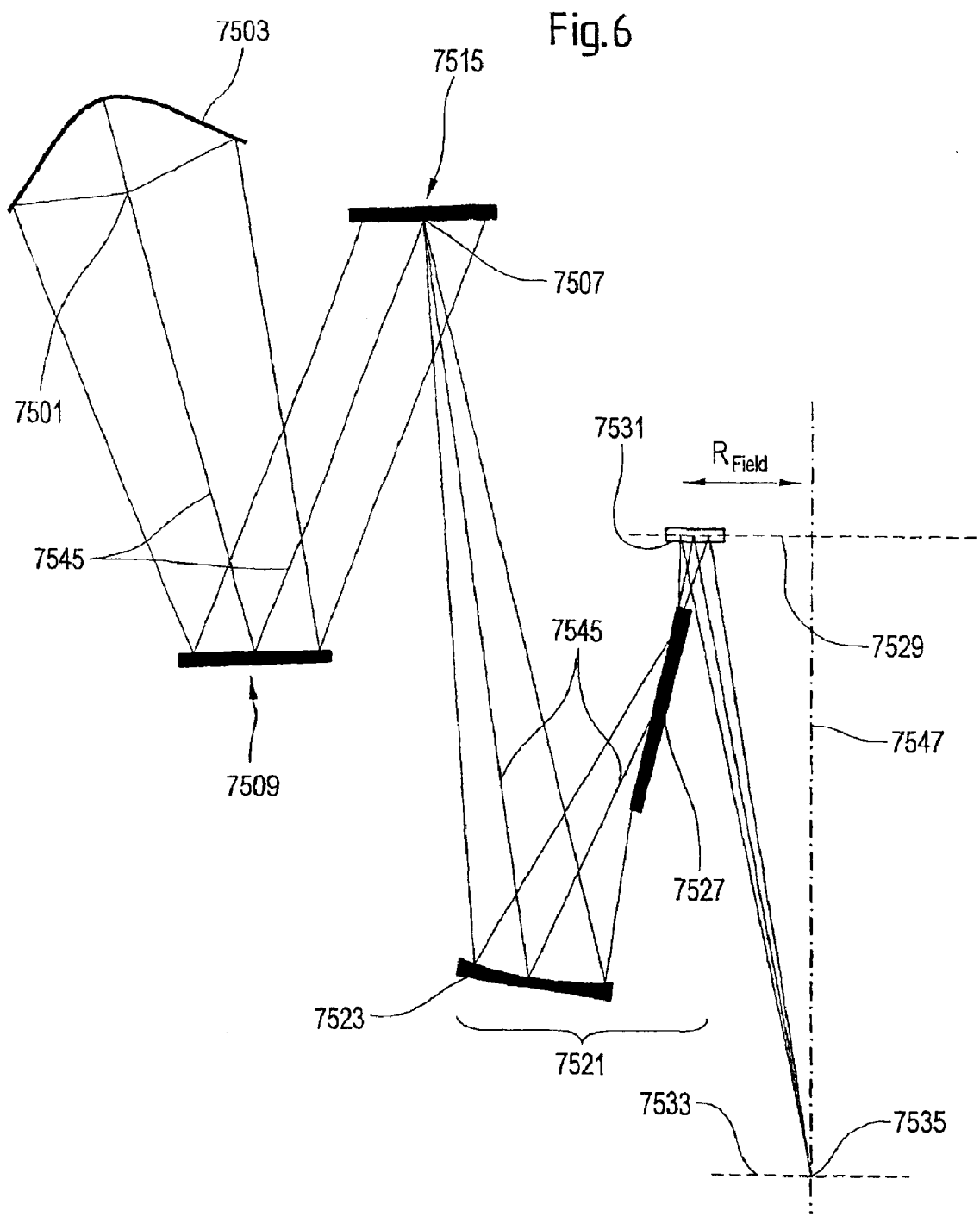
FIG. 6: A schematic view of a third embodiment with a concave pupil-imaging field mirror and a convex field-forming field mirror.

FIG. 6 shows a schematic view of a embodiment comprising a light source 7501, a collector mirror 7503, a plate with the field raster elements 7509, a plate with the pupil raster elements 7515, a field lens 7521, a image plane 7529 and a exit pupil 7535. The field lens 7521 has one normal-incidence mirror 7523 with positive optical power for pupil imaging and one grazing-incidence mirror 7527 with negative optical power for field shaping. Exemplary for the imaging of all secondary light sources, the imaging of one secondary light source 7507 into the exit pupil 7533 forming a tertiary light source 7535 is shown. The optical axis 7545 of the illumination system is not a straight line but is defined by the connection lines between the single components being intersected by the optical axis 7545 at the centers of the components. Therefore, the illumination system is a non-centered system having an optical axis 7545 being bent at each component to get a beam path free of vignetting. There is no common axis of symmetry for the optical components. Projection objectives for EUV exposure apparatus are typically centered systems with a straight optical axis and with an off-axis object field. The optical axis 7547 of the projection objective is shown as a dashed line. The distance between the center of the field 7531 and the optical axis 7547 of the projection objective is equal to the field radius $R_{field}$.

Figure 7:
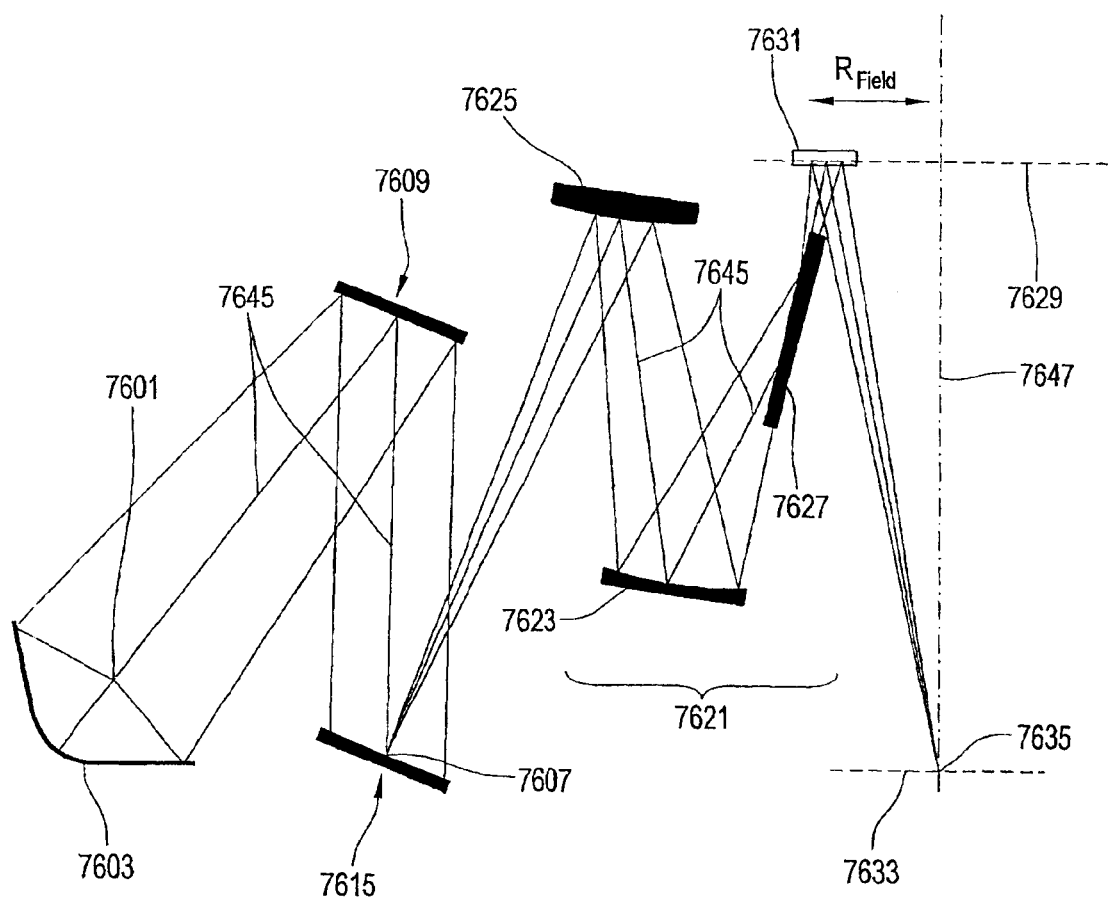
FIG. 7: A schematic view of a further embodiment with a second optical component comprising a telescope system and a convex field-forming field mirror.

In another embodiment as shown in FIG. 7, a telescope objective in the field lens 7621 comprising the field mirror 7623 with positive optical power, the field mirror 7625 with negative optical power and the field mirror 7627 is applied to reduce the track length. Corresponding elements have the same reference numbers as those in FIG. 6 increased by 100. Therefore, the description to these elements is found in the description to FIG. 6. The field mirror 7625 and the field mirror 7623 of the telescope objective in FIG. 5 are formed as an off-axis Cassegrainian configuration. The telescope objective has an object plane at the secondary light sources 7607 and an image plane at the exit pupil 7633 of the illumination system. The pupil plane of the telescope objective is arranged at the image plane 7629 of the illumination system. In this configuration, having five normal-incidence reflections at the mirrors 7603, 7609, 7615, 7625 and 7623 and one grazing-incidence reflection at the mirror 7627, all mirrors are arranged below the image plane 7629 of the illumination system. Therefore, there is enough space to install the reticle and the reticle support system.

Figure 8:
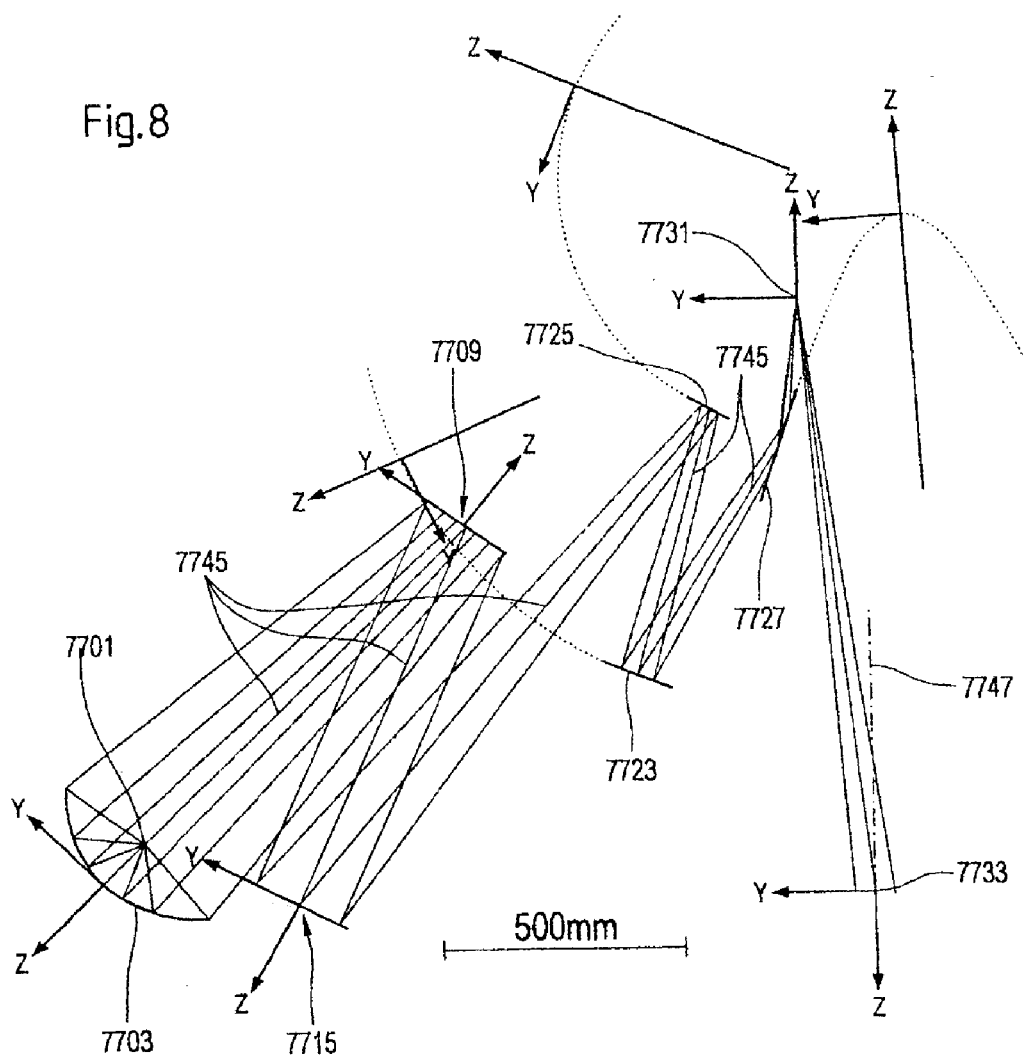
FIG. 8: A detailed view of the embodiment of FIG. 7.

In FIG. 8 a detailed view of the embodiment of FIG. 7 is shown. Corresponding elements have the same reference numbers as those in FIG. 7 increased by 100. Therefore, the description to these elements is found in the description to FIG. 7. The components are shown in a y-z-sectional view, wherein for each component the local co-ordinate system with the y- and z-axis is shown. For the collector mirror 7703 and the field mirrors 7723, 7725 and 7727 the local co-ordinate systems are defined at the vertices of the mirrors. For the two plates with the raster elements the local co-ordinate systems are defined at the centers of the plates. In table 2 the arrangement of the local co-ordinate systems with respect to the local co-ordinate system of the light source 7701 is given. The tilt angles α,β and γ about the x-, y- and z-axis are defined in a right-handed system.

TABLE 2

Co-ordinate systems of vertices of mirrors

| | X [mm] | Y [mm] | Z [mm] | α [°] | β [°] | γ [°] |
|---|---|---|---|---|---|---|
| Light source 7701 | 0.0 | 0.0 | 0.0 | 0.0 | 0.0 | 0.0 |
| Collector mirror 7703 | 0.0 | 0.0 | 125.0 | 0.0 | 0.0 | 0.0 |
| Plate with field raster elements 7709 | 0.0 | 0.0 | −975.0 | 10.5 | 180.0 | 0.0 |
| Plate with pupil raster elements 7715 | 0.0 | −322.5 | −134.8 | 13.5 | 0.0 | 180.0 |
| Field mirror 7725 | 0.0 | 508.4 | −1836.1 | −67.8 | 0.0 | 180.0 |
| Field mirror 7723 | 0.0 | 204.8 | −989.7 | −19.7 | 0.0 | 180.0 |
| Field mirror 7727 | 0.0 | −163.2 | −2106.2 | 49.4 | 180.0 | 0.0 |
| Image plane 7731 | 0.0 | −132.1 | −1820.2 | 45.0 | 0.0 | 0.0 |
| Exit pupil 7733 | 0.0 | −1158.1 | −989.4 | 45.0 | 0.0 | 0.0 |

The surface data are given in table 3. The radius R and the conical constant K define the surface shape of the mirrors according to the formula $$z = \frac{\rho h^2}{1 + \sqrt{1 - (1+\kappa)\rho^2 h^2}} + \sum_{k=1}^{} c_k h^{2k+2},$$

wherein h is the radial distance of a surface point from the z-axis.

TABLE 3

Optical data of the components

| | Collector mirror 7703 | Field raster element 7709 | Pupil raster element 7715 | Field mirror 7725 | Field mirror 7723 | Field mirror 7727 |
|---|---|---|---|---|---|---|
| R [mm] | −235.3 | ∞ | −1239.7 | −534.7 | −937.7 | −65.5 |
| K | −0.77855 | 0.0 | 0.0 | −0.0435 | −0.0378 | −1.1186 |
| Focal length f [mm] | — | ∞ | 617.6 | −279.4 | 477.0 | −757.1 |

The light source 7701 in this embodiment is a Laser-Produced-Plasma source having a diameter of approximately 0.3 mm generating a beam cone with an opening angle of 83°. To decrease the contamination of the collector mirror 7703 by debris of the source 7701 the distance to the collector mirror 7703 is set to 125 mm.

The collector mirror 7703 is an elliptical mirror, wherein the light source 7701 is arranged in the first focal point of the ellipsoid and wherein the plate with the pupil raster elements 7715 is arranged in the second focal point of the ellipsoid.

Therefore the field raster elements 7709 can be designed as planar mirrors. The distance between the vertex of the collector mirror 7703 and the center of the plate with the field raster elements 7709 is 1100 mm. The field raster elements 7709 are rectangular with a length $X_{FRE}$=46.0 mm and a width $Y_{FRE}$=2.8 mm. The arrangement of the field raster elements is shown in FIG. 4. The tilt angles and tilt axis are different for each field raster element 7709, wherein the field raster elements are tilted to direct the incoming ray bundles to the corresponding pupil raster elements 7715. The tilt angles are in the range of −4° to 4°. The mean incidence angle of the rays on the field raster elements is 10.5°. Therefore the field raster elements 7709 are used at normal incidence.

The plate with the pupil raster elements 7715 is arranged in a distance of 900 mm from the plate with the field raster elements 7709. The pupil raster elements 7715 are concave mirrors. The arrangement of the pupil raster elements 7715 is shown in FIG. 5. The tilt angles and tilt axis are different for each pupil raster element 7715, wherein the pupil raster elements 7715 are tilted to superimpose the images of the field raster elements 7709 in the image plane 7731. The tilt angles are in the range of −4° to 4°. The mean incidence angle of the rays on the pupil raster elements 7715 is 7.5°. Therefore the pupil raster elements 7715 are used at normal incidence.

The field mirror 7725 is a convex mirror. The used area of this mirror defined by the incoming rays is an off-axis segment of a rotational symmetric conic surface. The mirror surface is drawn in FIG. 6 from the vertex up to the used area as dashed line. The distance between the center of the plate with the pupil raster elements 7715 and the center of the used area on the field mirror 7725 is 1400 mm. The mean incidence angle of the rays on the field mirror 7725 is 12°. Therefore the field mirror 7725 is used at normal incidence.

The field mirror 7723 is a concave mirror. The used area of this mirror defined by the incoming rays is an off-axis segment of a rotational symmetric conical surface. The mirror surface is drawn in FIG. 75 from the vertex up to the used area as dashed line. The distance between the center of the used area on the field mirror 7725 and the center of the used area on the field mirror 7723 is 600 mm. The mean incidence angle of the rays on the field mirror 7723 is 7.5°. Therefore the field mirror 7723 is used at normal incidence.

The field mirror 7727 is a convex mirror. The used area of this mirror defined by the incoming rays is an off-axis segment of a rotational symmetric conic surface. The mirror surface is drawn in FIG. 6 from the vertex up to the used area as dashed line. The distance between the center of the used area on the field mirror 7723 and the center of the used area on the field mirror 7727 is 600 mm. The mean incidence angle of the rays on the field mirror 7727 is 78°. Therefore the field mirror 7727 is used at grazing incidence. The distance between the field mirror 7727 and the image plane 7731 is 300 mm.

In another embodiment the field mirror and the field mirror are replaced with on-axis toroidal mirrors. The vertices of these mirrors are arranged in the centers of the used areas. The convex field mirror has a radius $R_y$=571.3 mm in the y-z-section and a radius $R_x$=546.6 mm in the x-z-section. This mirror is tilted about the local x-axis about 12° to the local optical axis 7745 defined as the connection lines between the centers of the used areas of the mirrors. The concave field mirror has a radius $R_y$=−962.14 mm in the y-z-section and a radius $R_x$=−945.75 mm in the x-z-section. This mirror is tilted about the local x-axis about 7.5° to the local optical axis 7745.

Figure 9:
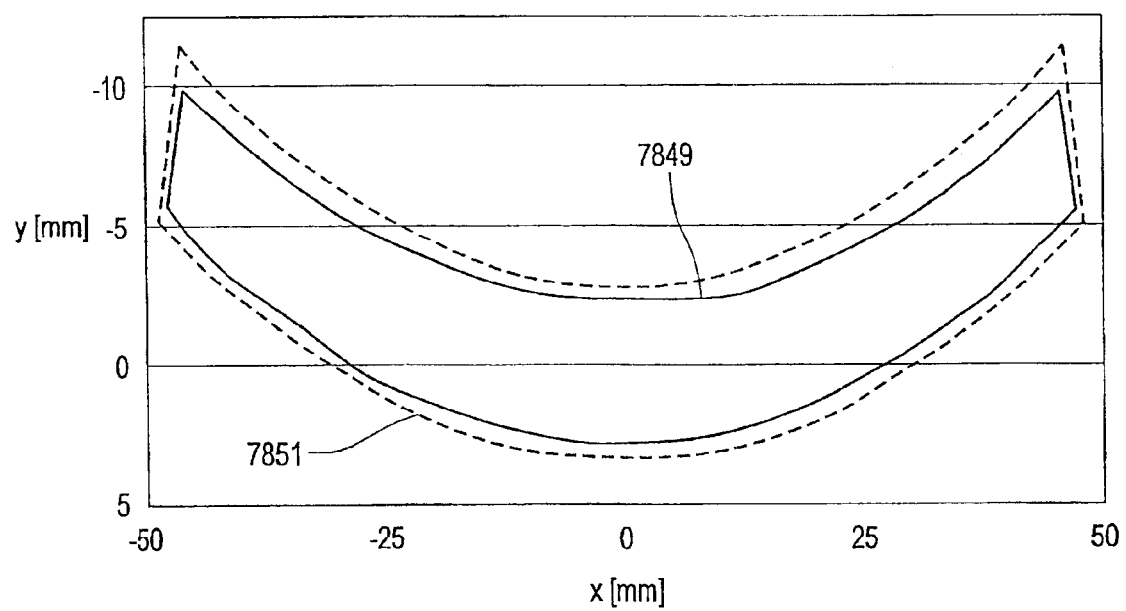
FIG. 9: Intensity distribution of the embodiment of FIG. 7.

FIG. 9 shows the illuminated arc-shaped area in the image plane 7731 of the illumination system presented in FIG. 8. The orientation of the y-axis is defined in FIG. 8. The solid line 7849 represents the 50%-value of the intensity distribution, the dashed line 7851 the 10%-value. The width of the illuminated area in y-direction is constant over the field. The intensity distribution is the result of a simulation done with the optical system given in table 2 and table 3.

Figure 10:
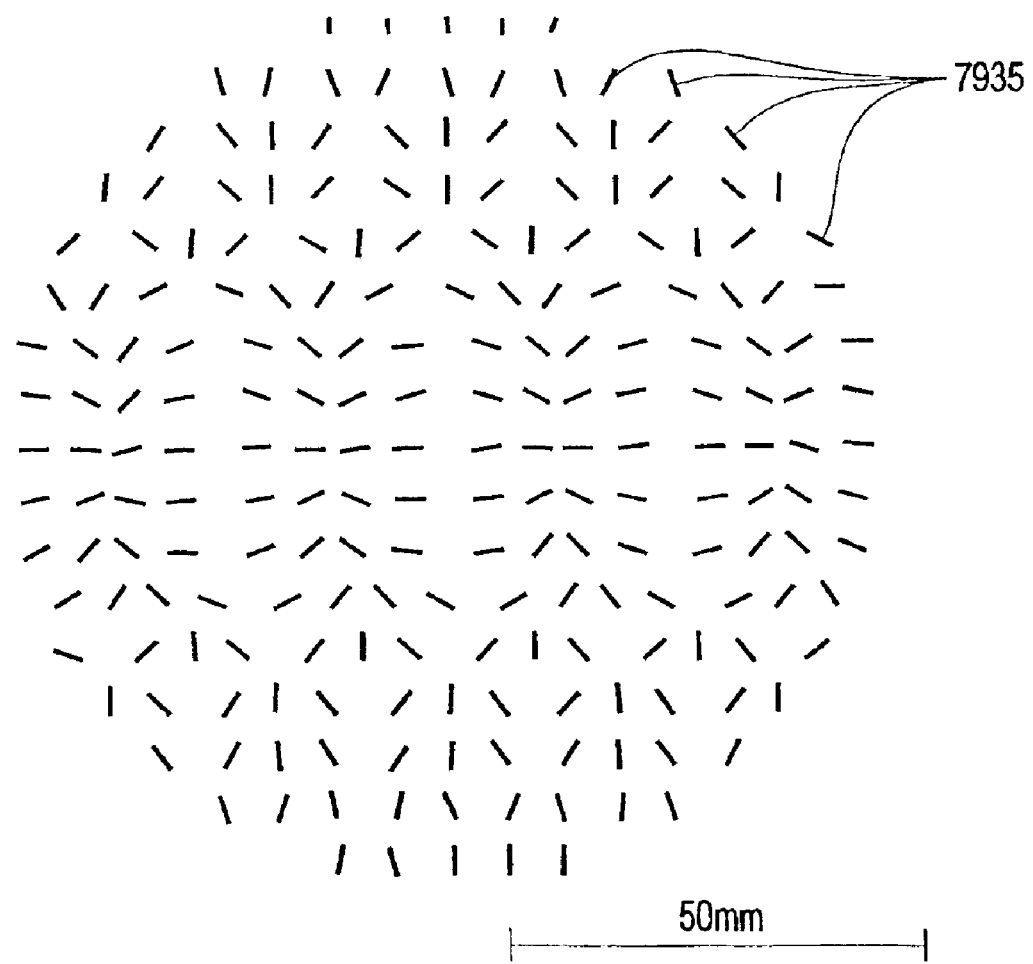
FIG. 10: Illumination of the exit pupil of the illumination system of the embodiment of FIG. 7.

FIG. 10 shows the illumination of the exit pupil 7733 for an object point in the center (x=0 mm; y=0 mm) of the illuminated field in the image plane 7731. The arrangement of the tertiary light sources 7935 corresponds to the arrangement of the pupil raster elements 7715, which is presented in FIG. 5. Wherein the pupil raster elements in FIG. 5 are arranged on a distorted grid, the tertiary light sources 7935 are arranged on a undistorted regular grid. It is obvious in FIG. 10, that the distortion errors of the imaging of the secondary light sources due to the tilted field mirrors and the field-shaping field mirror are compensated. The shape of the tertiary light sources 7935 is not circular, since the light distribution in the exit pupil 7733 is the result of a simulation with a Laser-Plasma-Source which was not spherical but ellipsoidal. The source ellipsoid was oriented in the direction of the local optical axis. Therefore also the tertiary light sources are not circular, but elliptical. Due to the mixing of the light channels and the user-defined assignment between the field raster elements and the pupil raster elements, the orientation of the tertiary light sources 7935 is different for each tertiary light source 7935.

Due to the mixing of the light channels and the user-defined assignment between the field raster elements and the pupil raster elements, the orientation of the tertiary light sources 7935 is different for nearby each tertiary light source 7935. Therefore, the planes of incidence of at least two field raster elements have to intersect each other. The plane of incidence of a field raster element is defined by the centroid ray of the incoming bundle and its corresponding deflected ray.

Figure 11:
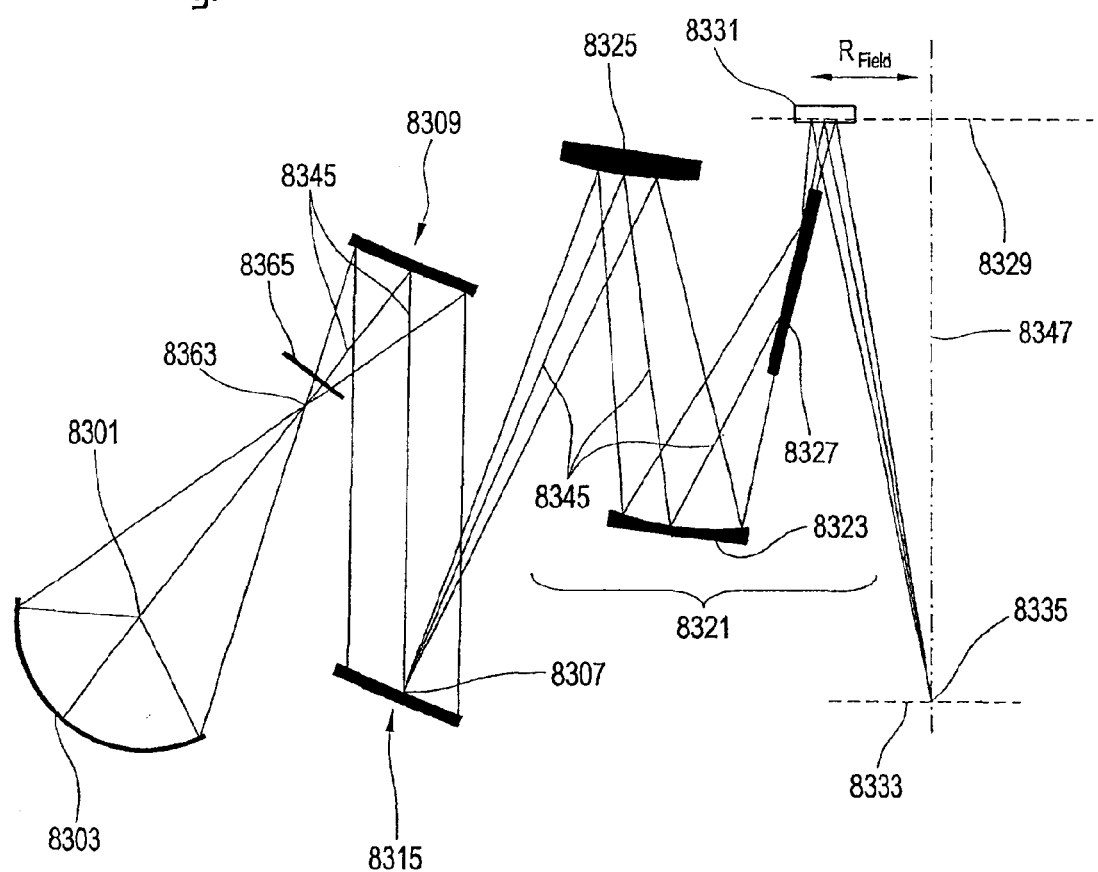
FIG. 11: A schematic view of a embodiment with an intermediate image of the light source.

FIG. 11 shows another embodiment in a schematic view. Corresponding elements have the same reference numbers as those in FIG. 6 increased by 800. Therefore, the description to these elements is found in the description to FIG. 6. In this embodiment the collector mirror 8303 is designed to generate an intermediate image 8361 of the light source 8301 in front of the plate with the field raster elements 8309. Nearby this intermediate image 8363 a transmission plate 8365 is arranged. The distance between the intermediate image 8363 and the transmission plate 8365 is so large that the plate 8365 will not be destroyed by the high intensity near the intermediate focus. The distance is limited by the maximum diameter of the transmission plate 8365 which is in the order of 200 mm. The maximum diameter is determined by the possibility to manufacture a plate being transparent at EUV. The transmission plate 8365 can also be used as a spectral purity filter to select the used wavelength range. Instead of the absorptive transmission plate 8365 also a reflective grating filter can be used. The plate with the field raster elements 8309 is illuminated with a diverging ray bundle. Since the tilt angles of the field raster elements 8309 are adjusted according to a collecting surface the diverging beam path can be transformed to a nearly parallel one. Additionally, the field raster elements 8309 are tilted to deflect the incoming ray bundles to the corresponding pupil raster elements 8315.

Figure 12:
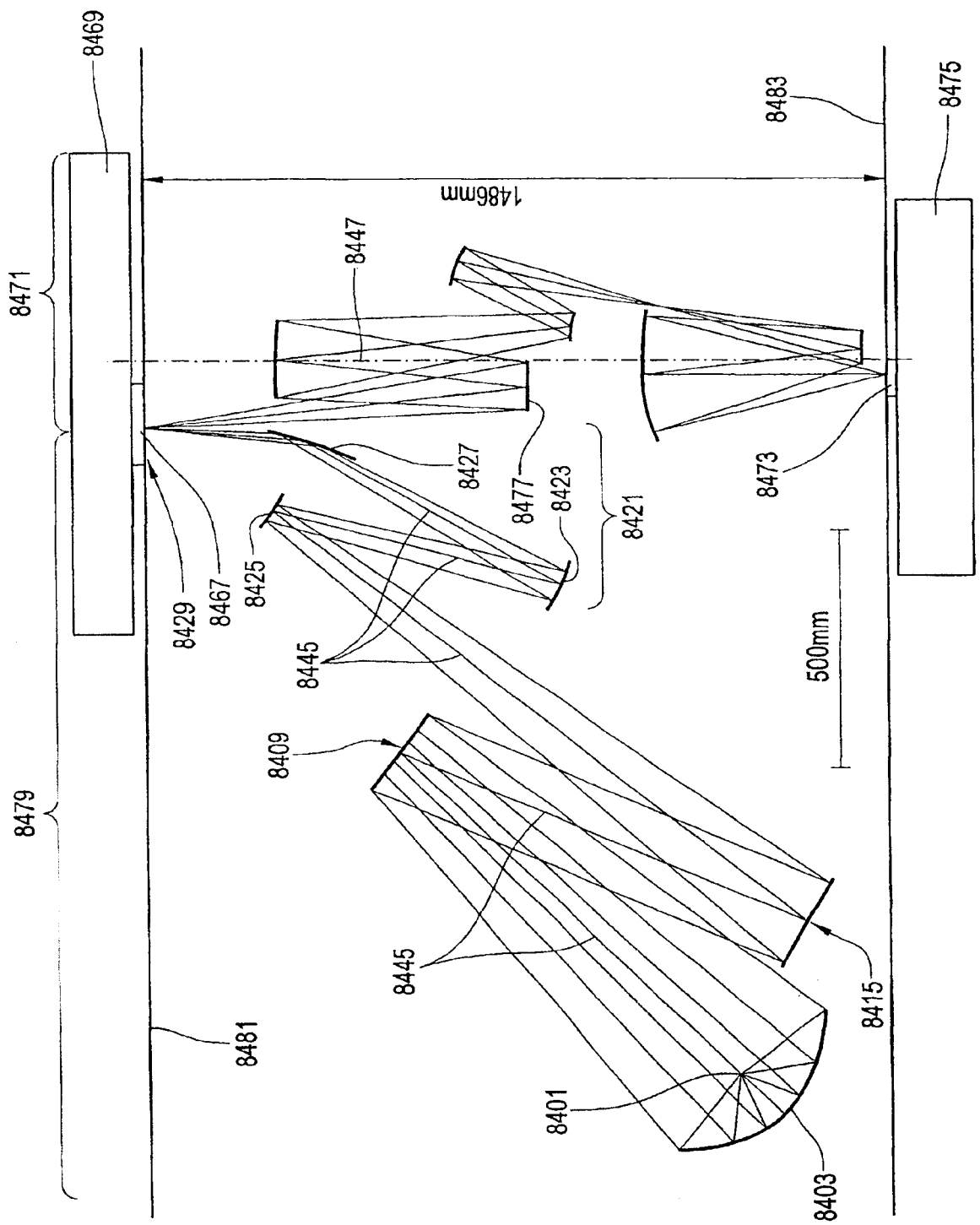
FIG. 12: A detailed view of a projection exposure apparatus.

FIG. 12 shows an EUV projection exposure apparatus in a detailed view. The illumination system is the same as shown in detail in FIG. 8. Corresponding elements have the same reference numbers as those in FIG. 8 increased by 700. Therefore, the description to these elements is found in the description to FIG. 8. In the image plane 8429 of the illumination system the reticle 8467 is arranged. The reticle 8467 is positioned by a support system 8469. The projection objective 8471 having six mirrors images the reticle 8467 onto the wafer 8473 which is also positioned by a support system 8475. The mirrors of the projection objective 8471 are centered on a common straight optical axis 8447. The arc-shaped object field is arranged off-axis. The direction of the beam path between the reticle 8467 and the first mirror 8477 of the projection objective 8471 is tilted to the optical axis 8447 of the projection objective 8471. The angles of the chief rays 8479 with respect to the normal of the reticle 8467 are between 5° and 7°. As shown in FIG. 80 the illumination system 8479 is well separated from the projection objective 8471. The illumination and the projection beam path interfere only nearby the reticle 8467. The beam path of the illumination system is folded with reflection angles lower than 25° or higher than 75° in such a way that the components of the illumination system are arranged between the plane 8481 with the reticle 8467 and the plane 8383 with the wafer 8473.

What is claimed is:

1. Illumination system, particularly for microlithography with wavelengths ≦193 nm, comprising:
   a primary light source;
   a first optical component;
   a second optical component;
   an image plane; and
   an exit pupil,
   wherein said first optical component transforms said primary light source into a plurality of secondary light sources that are imaged by said second optical component in said exit pupil,
   wherein said first optical component includes a first optical element having a plurality of first raster elements, that are imaged into said image plane, producing a plurality of images being superimposed at least partially on a field in said image plane,
   wherein said plurality of first raster elements are rectangular,
   wherein said field is a segment of an annulus,
   wherein said second optical component includes a first field mirror with negative optical power for shaping said field to said segment of said annulus and a second field mirror with positive optical power,
   wherein each of a plurality of rays intersects said first field mirror with an incidence angle greater than 70°, and
   wherein each of said plurality of rays intersects said second field mirror with an incidence angle of less than 25°.

2. The illumination system according to claim 1, wherein said first field mirror is an off-axis segment of a rotational symmetric reflective surface.

3. The illumination system according to claim 1, wherein said first field mirror is an on-axis segment of a toroidal reflective surface.

4. The illumination system according to claim 1, wherein said second field mirror is an off-axis segment of a rotational symmetric reflective surface.

5. The illumination system according to claim 1, wherein said second field mirror is an on-axis segment of a toroidal reflective surface.

6. The illumination system according to claim 1, wherein said second optical component comprises a third field mirror.

7. The illumination system according to claim 6, wherein said third mirror has negative optical power.

8. The illumination system according to claim 6, wherein said first, second and third field mirrors form (a) a telescope-objective with a tele-object plane at said plurality of secondary light sources, (b) a tele-pupil plane at said image plane of said illumination system, and (c) a tele-image plane at said exit pupil.

9. The illumination system according to claim 6, wherein each of a plurality of rays intersects said third field mirror with an incidence angle less than 25°.

10. The illumination system according to claim 6, wherein said third field mirror is an off-axis segment of a rotational symmetric reflective surface.

11. The illumination system according to claim 6, wherein said third field mirror is an on-axis segment of a toroidal reflective surface.

12. The illumination system according to claim 6, wherein said first, second and third field mirrors are forming a non-centered system.

13. The illumination system according to claim 1, wherein said second optical component comprises an even number of normal incidence mirrors having incidence angles of less than 25°.

14. The illumination system according to claim 1,
   wherein said first optical component further comprises a second optical element having a plurality of second raster elements,
   wherein each of said plurality of first raster elements corresponds to one of said plurality of second raster elements, and
   wherein each of said plurality of first raster elements deflects an incoming ray bundle to said corresponding one of said plurality of second raster elements.

15. The illumination system according to claim 14, wherein said plurality of second raster elements and said second optical component image said corresponding plurality of first raster elements into said image plane.

16. The illumination system according to claim 14, wherein said plurality of second raster elements are concave mirrors.

17. A projection exposure apparatus for microlithography comprising:
   the illumination system of claim 1;
   a reticle being located at said image plane;
   a light-sensitive object on a support system; and
   a projection objective to image said reticle onto said light-sensitive object.

* * * * *